(12) United States Patent
Fortier

(10) Patent No.: US 8,824,701 B2
(45) Date of Patent: Sep. 2, 2014

(54) DETERMINING AUTOMATIC GAIN CONTROL LEVELS

(75) Inventor: Ray Fortier, Colorado Springs, CO (US)

(73) Assignee: Fairchild Semiconductor Corporation, San Jose, CA (US)

(*) Notice: Subject to any disclaimer, the term of this patent is extended or adjusted under 35 U.S.C. 154(b) by 531 days.

(21) Appl. No.: 13/159,167

(22) Filed: Jun. 13, 2011

(65) Prior Publication Data

US 2012/0206184 A1    Aug. 16, 2012

Related U.S. Application Data

(60) Provisional application No. 61/441,811, filed on Feb. 11, 2011.

(51) Int. Cl.
| | |
|---|---|
| *H03L 5/00* | (2006.01) |
| *H03G 3/00* | (2006.01) |
| *H03F 99/00* | (2009.01) |
| *H04R 25/00* | (2006.01) |

(52) U.S. Cl.
USPC ............................. 381/107; 381/120; 327/306

(58) Field of Classification Search
USPC ................. 381/107, 104, 109, 312, 323, 120;
330/284, 277, 285; 327/306
See application file for complete search history.

(56) References Cited

U.S. PATENT DOCUMENTS 4,243,947 A * 1/1981 Glennon ...................... 330/284

FOREIGN PATENT DOCUMENTS

| CN | 201078843 Y | 6/2008 |
| CN | 102684626 A | 9/2012 |
| JP | 4323348 B2 | 9/2009 |

OTHER PUBLICATIONS

Intersil, "Understanding Current Output Digital to Analog Converters", Application Note Jun. 1999, Analog devices, pp. 1, and 2 AN9845.*

"Chinese Application Serial No. 201210042834.X, Office Action mailed Jan. 17, 2014", 9 pgs.

* cited by examiner

*Primary Examiner* — Xu Mei
*Assistant Examiner* — Ammar Hamid
(74) *Attorney, Agent, or Firm* — Schwegman, Lundberg & Woessner, P.A.

(57) ABSTRACT

An apparatus comprises an integrated circuit (IC) and a resistor external to the IC. The IC includes a current output digital-to-analog converter (IDAC) circuit configured to provide an adjustable specified current to a resistor external to the apparatus, a voltage sensing circuit configured to sense the voltage of the external resistor, and an automatic gain control (AGC) circuit configured to receive threshold information using the adjustable specified current.

17 Claims, 1 Drawing Sheet

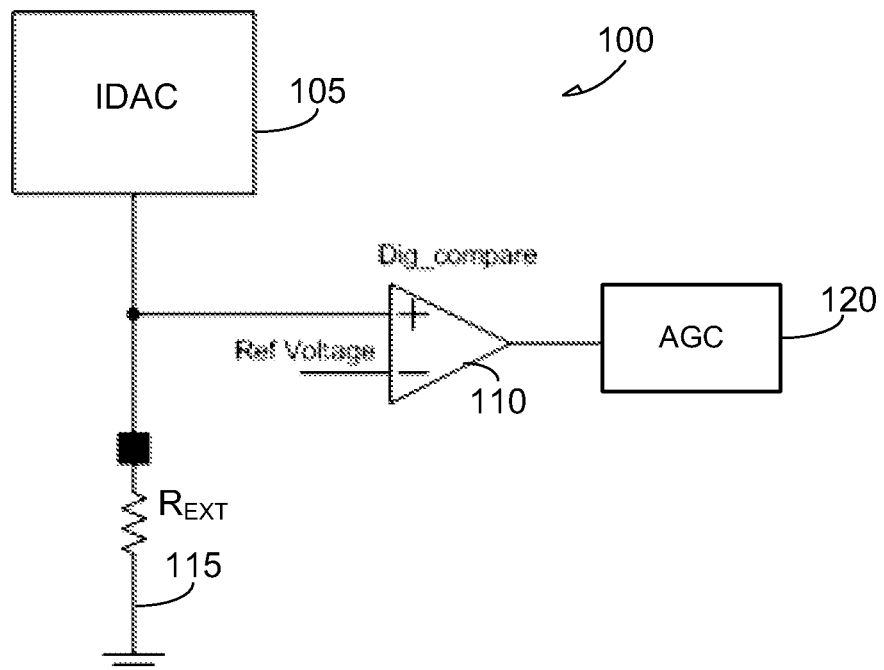

DETERMINING AUTOMATIC GAIN CONTROL LEVELS

CROSS-REFERENCE TO RELATED APPLICATIONS

This application claims the benefit of priority, under 35 U.S.C. §119(e), of U.S. Provisional Application No. 61/441, 811, filed on Feb. 11, 2011, which is incorporated herein by reference in its entirety.

BACKGROUND

Some examples of electronic systems and devices include MP3 portable media players, cellular phones, and smart phones. Popularity of the devices stems in part from the functionality they provide despite their small size. It is desirable to continue to provide more functionality in such devices even though it is desired to keep the devices at their same small size or to make them even smaller.

OVERVIEW

This document relates generally to electronic devices and electronic systems that include automatic gain control. An apparatus example comprises an integrated circuit (IC) and a resistor external to the IC. The IC includes a current output digital-to-analog converter (IDAC) circuit configured to provide an adjustable specified current to a resistor external to the apparatus, a voltage sensing circuit configured to sense the voltage of the external resistor, and an automatic gain control (AGC) circuit configured to receive threshold information using the adjustable specified current.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 illustrates generally an example of a device including an AGC circuit.

DETAILED DESCRIPTION

Automatic gain control (AGC) circuits can be configured to adjust a gain of a signal (e.g., voltage gain) depending on the level of the signal, or in certain examples, depending on the error between an expected level and the actual level. In various applications, AGC circuits can be used to avoid or limit clipping of an amplified signal, to limit changes in a signal, etc. In an example, an AGC circuit can be configured to receive an input signal and provide a modulated output signal, wherein the gain of the output signal depends on at least one of the input or the output signal, or on an error between an expected input or output level and the actual input or output level. In certain examples, one or more thresholds can be selected, for example, using a resistor external to the AGC circuit or an external resistor network.

The present inventor has recognized, among other things, an automatic gain control (AGC) circuit and method having one or more threshold levels adjustable, in certain examples, using a single external resistor. The AGC circuit and method disclosed herein can reduce the number of input/output (I/O) pins typically required in AGC applications, or can reduce the need for multiple threshold levels for the AGC function. In certain examples, the AGC circuit is included in an integrated circuit (IC) and methods disclosed herein can allow only one IC connector pin or I/O to be used during startup procedures.

In an example, a single external resistor can be used to select one or more threshold levels in an AGC application. The value of the external resistor can determine a voltage level (e.g., a battery voltage level) at which the AGC function can begin to modify the gain of a signal, such as a signal on an audio channel. In an example, the value of the external resistor can be determined using a current output digital-to-analog converter (IDAC), such as by driving a specified current into the external resistor and comparing the resulting voltage to one or more reference voltages. The reference voltage or voltages can be generated by a voltage reference circuit (e.g., a bandgap reference circuit) in the IC.

FIG. 1 illustrates generally an example of a device 100 including an IDAC 105, a voltage sensing circuit 110 (e.g., a comparator), and an external resistor ($R_{Ext}$) 115. The IDAC 105 can include a programmable IDAC configured to generate and provide a specified current into $R_{EXT}$ 115 to produce a resulting voltage. The value of $R_{EXT}$ can be determined by comparing the resulting voltage to a reference voltage using the comparator 110. In an example, a specific resistor value can correspond to a specific threshold value or to a specific set of threshold values. The device 100 can be included in a system having an audio channel with AGC.

In an example, the IDAC 105 can be ramped until the voltage on the external resistor exceeds the reference voltage. The programmed IDAC current can be used to determine the value of $R_{ExT}$ 115 and to select the threshold level for the AGC circuit 120 and method. In an example, a lookup table stored in a memory circuit (e.g., coupled to or integral to the AGC circuit) can be used to determine the value of $R_{EXT}$ 115 and to select the threshold level for the AGC function. Further, external resistor values can be selected to eliminate overlap for resistor or IDAC errors. In some examples, the reference voltage is fixed and the threshold voltage is determined from the lookup table according to the programmed IDAC current.

Additional Examples and Notes

Example 1 includes subject matter (such as an apparatus) comprising an integrated circuit (IC) and a resistor external to the IC. The IC includes a current output digital-to-analog converter (IDAC) circuit configured to provide an adjustable specified current to a resistor external to the apparatus, a voltage sensing circuit configured to sense the voltage of the external resistor, and an automatic gain control (AGC) circuit configured to receive threshold information using the adjustable specified current.

In Example 2, the subject matter of Example 1 can optionally include the external resistor, the IDAC circuit, and the voltage sensing circuit coupled to a single input/output (I/O) pin of the IC.

In Example 3, the subject matter of one or any combination of Examples 1 and 2 can optionally include an IC configured to receive a battery voltage. The AGC circuit can be configured to modify gain applied to a signal input to the AGC circuit when the battery voltage satisfies a threshold voltage and adjust the threshold voltage according to the specified current.

In Example 4, the subject matter of one or any combination of Examples 1-3 can optionally include a memory circuit configured to store a lookup table. The value of resistance of the external resistor can be determined from the lookup table using the sensed voltage and the specified current. The AGC circuit can be configured to set the threshold voltage of the AGC circuit according to the resistance value.

In Example 5, the subject matter of one or any combination of Examples 1-4 can optionally include a voltage sensing circuit that can be a comparator having a first input communicatively coupled to the external resistor, a second input configured to receive a reference voltage, and an output to generate an indication based on a comparison of the first and second inputs.

In Example 6, the subject matter of one or any combination of Examples 1-5 can optionally include a memory circuit configured to store a lookup table. A comparator can be configured to generate the indication when the resistor voltage exceeds the reference voltage, and the AGC circuit can be configured to modify gain according to a threshold voltage. A value of the threshold voltage can be determined from the lookup table according to a current value that generated the indication.

In Example 7, the subject matter of one or any combination of Examples 1-6 can optionally include an IDAC circuit is configured to ramp the specified current through the external resistor until the resistor voltage exceeds the reference voltage.

Example 8 includes subject matter (such as a method, a means for performing acts, or a machine-readable medium including instructions that, when performed by the machine, cause the machine to perform acts), or can optionally be combined with the subject matter of one or any combination of Examples 1-7 to include such subject matter, comprising adjusting a specified current to a resistor external to an IC using an IDAC circuit of the IC, sensing a voltage on the external resistor using the IC, and deriving threshold information for an AGC circuit of the IC according to the specified current.

In Example 9, the subject matter of Example 8 can optionally include adjusting a threshold voltage of the AGC circuit according to the specified current, and the AGC circuit can modify gain of an AGC input signal when a battery voltage satisfies the threshold voltage.

In Example 10, the subject matter of one or any combination of Examples 8 and 9 can optionally include deriving the resistance value of the external resistor from the sensed voltage and the specified current, and setting a threshold voltage of the AGC circuit according to the resistance value.

In Example 11, the subject matter of one or any combination of Examples 8-10 can optionally include generating an indication when the resistor voltage exceeds a reference voltage and setting a threshold voltage of the AGC circuit according to a current that generated the indication.

In Example 12, the subject matter of one or any combination of Examples 8-11 can optionally include adjusting a specified current through the external resistor includes ramping the specified current through the external resistor until the resistor voltage exceeds the reference voltage.

In Example 13, the subject matter of one or any combination of Examples 8-12 can optionally include providing automatic gain control to an audio channel of the IC.

Example 14 can include subject matter (such as a system), or can optionally be combined with subject matter of one or any combination of Examples 1-13 to include such subject matter, comprising a resistor and an IC coupled to the resistor. The IC includes an IDAC circuit configured to provide an adjustable specified current to a resistor external to the apparatus, a voltage sensing circuit configured to sense the voltage of the external resistor, and an audio channel having an AGC circuit configured to receive threshold information using the adjustable specified current.

In Example 15, the subject matter of Example 14 can optionally include a comparator having a first input communicatively coupled to the external resistor, a second input configured to receive a reference voltage, and an output to generate an indication based on a comparison of the first and second inputs, and the IC can include an I/O pin. The first comparator input, the external resistor and an output of the IDAC can be coupled to the I/O pin.

In Example 16, the subject matter of one or any combination of Examples 14 and 15 can optionally include a voltage reference circuit coupled to the second comparator input and configured to generate the voltage reference.

In Example 17, the subject matter of one or any combination of Examples 14-17 can optionally include an IC that can be configured to receive a battery voltage. The AGC circuit can be configured to modify gain applied to a signal input to the AGC circuit when the battery voltage satisfies a threshold voltage, and adjust the threshold voltage according to the specified current.

In Example 18, the subject matter of one or any combination of Examples 14-17 can optionally include a memory circuit configured to store a lookup table. A value of resistance of the external resistor is determined from the lookup table using the sensed voltage and the specified current, and the AGC circuit is configured to set the threshold voltage of the AGC circuit according to the resistance value.

In Example 19, the subject matter of one or any combination of Examples 14-17 can optionally include a memory circuit configured to store a lookup table and a comparator configured to generate an indication when the resistor voltage exceeds the reference voltage. The AGC circuit can be configured to modify gain according to a threshold voltage and a value of the threshold voltage can be determined from the lookup table according to a value of IDAC current that generated the indication.

In Example 20, the subject matter of one or any combination of Examples 14-19 can optionally include an IDAC circuit configured to ramp the specified current in the external resistor until the resistor voltage exceeds the reference voltage.

The above detailed description includes references to the accompanying drawings, which form a part of the detailed description. The drawings show, by way of illustration, specific embodiments in which the invention can be practiced.

These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
an integrated circuit (IC) and a resistor external to the IC, wherein the IC includes:
a current output digital-to-analog converter (IDAC) circuit configured to provide an adjustable specified current to a resistor external to the apparatus;
a voltage sensing circuit configured to sense the voltage of the external resistor; and
an automatic gain control (AGC) circuit configured to receive threshold information using the adjustable specified current, wherein the IC is configured to receive a battery voltage, and wherein the AGC circuit is configured to modify gain applied to a signal input to the AGC circuit when the battery voltage satisfies a threshold voltage and to adjust the threshold voltage according to the specified current.

2. The apparatus of claim 1, wherein, the external resistor, the IDAC circuit, and the voltage sensing circuit are coupled to a single input/output (I/O) pin of the IC.

3. The apparatus of claim 1, including:
a memory circuit configured to store a lookup table,
wherein a value of resistance of the external resistor is determined from the lookup table using the sensed voltage and the specified current, and
wherein the AGC circuit is configured to set the threshold voltage of the AGC circuit according to the resistance value.

4. The apparatus of claim 1, wherein the voltage sensing circuit includes a comparator having a first input communicatively coupled to the external resistor, a second input configured to receive a reference voltage, and an output to generate an indication based on a comparison of the first and second inputs.

5. The apparatus of claim 4, including:
a memory circuit configured to store a lookup table,
wherein the comparator is configured to generate the indication when the resistor voltage exceeds the reference voltage,
wherein the AGC circuit is configured to modify gain according to a threshold voltage, and
wherein a value of the threshold voltage is determined from the lookup table according to a current value that generated the indication.

6. The apparatus of claim 4, wherein the IDAC circuit is configured to ramp the specified current through the external resistor until the resistor voltage exceeds the reference voltage.

7. A method comprising:
adjusting a specified current to a resistor external to an integrated circuit (IC) using an IDAC circuit of the IC;
sensing a voltage on the external resistor using the IC;
deriving threshold information for an automatic gain control (AGC) circuit of the IC according to the specified current, and
adjusting a threshold voltage of the AGC circuit according to the specified current, wherein the AGC circuit modifies gain of an AGC input signal when a battery voltage satisfies the threshold voltage.

8. The method of claim 7, including:
deriving the resistance value of the external resistor from the sensed voltage and the specified current, and
wherein deriving threshold information includes setting a threshold voltage of the AGC circuit according to the resistance value.

9. The method of claim 7,
wherein sensing a voltage on the resistor includes generating an indication when the resistor voltage exceeds a reference voltage, and wherein deriving threshold information includes setting a threshold voltage of the AGC circuit according to a current that generated the indication.

10. The method of claim 9, wherein adjusting a specified current through the external resistor includes ramping the specified current through the external resistor until the resistor voltage exceeds the reference voltage.

11. The method of claim 7, including providing automatic gain control to an audio channel of the IC.

12. A system comprising:
a resistor; and
an IC coupled to the resistor, wherein the IC includes:
- a current output digital-to-analog converter (IDAC) circuit configured to provide an adjustable specified current to a resistor external to the apparatus;
- a voltage sensing circuit configured to sense the voltage of the external resistor; and
- an audio channel having an AGC circuit configured to receive threshold information using the adjustable specified current, wherein the voltage sensing circuit includes a comparator having a first input communicatively coupled to the external resistor, a second input configured to receive a reference voltage, and an output to generate an indication based on a comparison of the first and second inputs, and wherein the IDAC circuit is configured to ramp the specified current in the external resistor until the voltage of the external resistor exceeds the reference voltage.

13. The system of claim 12,
wherein the IC includes an I/O pin and the first comparator input, the external resistor and an output of the IDAC are coupled to the I/O pin.

14. The system of claim 13, including a voltage reference circuit coupled to the second comparator input and configured to generate the voltage reference.

15. The system of claim 13,
wherein the IC is configured to receive a battery voltage, and
wherein the AGC circuit is configured to:
- modify gain applied to a signal input to the AGC circuit when the battery voltage satisfies a threshold voltage; and
- adjust the threshold voltage according to the specified current.

16. The system of claim 15,
wherein the IC includes a memory circuit configured to store a lookup table,
wherein a value of resistance of the external resistor is determined from the lookup table using the sensed voltage and the specified current, and
wherein the AGC circuit is configured to set the threshold voltage of the AGC circuit according to the resistance value.

17. The system of claim 13, wherein the IC includes:
a memory circuit configured to store a lookup table,
wherein the comparator is configured to generate the indication when the resistor voltage exceeds the reference voltage,
wherein the AGC circuit is configured to modify gain according to a threshold voltage, and
wherein a value of the threshold voltage is determined from the lookup table according to a value of IDAC current that generated the indication.

* * * * *